(12) United States Patent
Di Dio

(10) Patent No.: US 11,735,512 B2
(45) Date of Patent: Aug. 22, 2023

(54) LEADFRAME WITH A METAL OXIDE COATING AND METHOD OF FORMING THE SAME

(71) Applicant: STMICROELECTRONICS INTERNATIONAL N.V., Geneva (CH)

(72) Inventor: Luca Maria Carlo Di Dio, Singapore (SG)

(73) Assignee: STMicroelectronics International N.V., Geneva (CH)

( * ) Notice: Subject to any disclaimer, the term of this patent is extended or adjusted under 35 U.S.C. 154(b) by 2 days.

(21) Appl. No.: 16/726,070

(22) Filed: Dec. 23, 2019

(65) Prior Publication Data

US 2020/0211953 A1 Jul. 2, 2020

Related U.S. Application Data

(60) Provisional application No. 62/787,026, filed on Dec. 31, 2018.

(51) Int. Cl.
*H01L 23/498* (2006.01)
*H01L 23/495* (2006.01)
(Continued)

(52) U.S. Cl.
CPC .... *H01L 23/49872* (2013.01); *H01L 21/4846* (2013.01); *H01L 21/565* (2013.01);
(Continued)

(58) Field of Classification Search
CPC ......... H01L 23/49558; H01L 23/49582; H01L 23/49586; H01L 23/49551; H01L 23/49548; H01L 23/49541
See application file for complete search history.

(56) References Cited

U.S. PATENT DOCUMENTS 4,800,178 A 1/1989 Mathew et al.
5,329,158 A * 7/1994 Lin ...................... H05K 3/3426
257/772

(Continued)

FOREIGN PATENT DOCUMENTS

CN 1047939 A 12/1990
CN 1148732 A 4/1997
(Continued)

OTHER PUBLICATIONS

JEDEC, "Test Method for Measuring Whisker Growth on Tin and Tin Alloy Surface Finishes," JEDEC Standard, JESD22-A121A, Jul. 2008, (Revision of JESD22-A121.01, Dec. 2005) 32 pages.
(Continued)

*Primary Examiner* — Mark W Tornow
*Assistant Examiner* — Abbigale A Boyle
(74) *Attorney, Agent, or Firm* — Seed IP Law Group LLP

(57) ABSTRACT

A leadframe including a metal oxide layer on at least a portion of the leadframe are disclosed. More specifically, leadframes with a metal layer and a metal oxide layer formed on one or more leads before a tin finish plating layer is formed are described. The layers of metal and metal oxide between the one or more leads and the tin finish plating layer reduce the formation of tin whiskers, thus reducing the likelihood of shorting and improving the overall reliability of the package structure and device produced.

14 Claims, 7 Drawing Sheets

(51) Int. Cl.
  *H01L 21/48* (2006.01)
  *H01L 21/56* (2006.01)
  *H01L 23/31* (2006.01)
(52) U.S. Cl.
  CPC .... *H01L 23/3114* (2013.01); *H01L 23/49582* (2013.01); *H01L 23/49586* (2013.01); *H01L 23/49861* (2013.01)

(56) References Cited

U.S. PATENT DOCUMENTS

| | | | |
|---|---|---|---|
| 5,728,285 A | 3/1998 | Mathew | |
| 6,037,653 A | 3/2000 | Kim et al. | |
| 6,040,633 A * | 3/2000 | Manteghi | H01L 24/48 257/784 |
| 6,150,711 A | 11/2000 | Kom et al. | |
| 6,646,330 B2 * | 11/2003 | Kubara | H01L 23/49582 257/676 |
| 7,190,057 B2 * | 3/2007 | Seki | H01L 24/48 257/E23.092 |
| 7,368,326 B2 * | 5/2008 | Osenbach | H01L 23/49582 257/734 |
| 7,391,116 B2 * | 6/2008 | Chen | C23C 28/347 257/762 |
| 9,059,185 B2 * | 6/2015 | Abbott | H01L 24/97 |
| 9,653,385 B1 * | 5/2017 | Fang | H01L 23/49558 |
| 9,679,832 B1 | 6/2017 | Heng | |
| 10,665,533 B2 * | 5/2020 | Sonehara | H01L 23/49548 |
| 2002/0047186 A1 * | 4/2002 | Tellkamp | H01L 23/49582 257/677 |
| 2002/0187364 A1 | 12/2002 | Heber et al. | |
| 2003/0201532 A1 | 10/2003 | Riedl | |
| 2007/0015001 A1 | 1/2007 | Uno et al. | |
| 2009/0108420 A1 | 4/2009 | Okura et al. | |
| 2010/0015577 A1 | 1/2010 | Cinader, Jr. et al. | |
| 2010/0155770 A1 | 6/2010 | Tomohiro et al. | |
| 2010/0195292 A1 | 8/2010 | Ide et al. | |
| 2011/0079887 A1 | 4/2011 | Shim et al. | |
| 2012/0205790 A1 | 8/2012 | Haga | |
| 2012/0299172 A1 | 11/2012 | Kim et al. | |
| 2019/0279942 A1 | 9/2019 | Crema et al. | |

FOREIGN PATENT DOCUMENTS

| | | |
|---|---|---|
| CN | 1949494 A | 4/2007 |
| CN | 101162712 A | 4/2008 |
| CN | 101314832 A | 12/2008 |
| CN | 102738109 A | 10/2012 |
| CN | 103928302 A | 7/2014 |
| CN | 104851866 A | 8/2015 |
| CN | 107154392 A | 9/2017 |
| EP | 0 538 019 A2 | 4/1993 |
| JP | 57-122554 A | 7/1982 |
| JP | 57-184244 A | 11/1982 |
| JP | 59-231844 A | 12/1984 |
| JP | 60-24045 A | 2/1985 |
| JP | 61-136699 A | 6/1986 |
| JP | 61-139050 A | 6/1986 |
| JP | 61-150284 A | 7/1986 |
| JP | 4-137552 A | 5/1992 |
| JP | 6-142161 A | 5/1994 |
| JP | 6-214452 A | 8/1994 |
| JP | 6-334087 A | 12/1994 |
| JP | 7-231060 A | 8/1995 |
| JP | 8-296050 A | 11/1996 |
| JP | 9-116064 A | 5/1997 |
| JP | 11-350188 A | 12/1999 |
| JP | 2003-155395 A | 5/2003 |
| JP | 2004-82103 A | 3/2004 |
| JP | 2004-282103 A | 10/2004 |
| JP | 2014-84476 A | 5/2014 |
| JP | 2014-192310 A | 10/2014 |
| JP | 2014-222751 A | 11/2014 |
| JP | 2015-103615 A | 6/2015 |
| KR | 10-2010-0039678 A | 4/2010 |
| WO | 95/18464 A1 | 7/1995 |
| WO | 2010/043291 A1 | 4/2010 |
| WO | 2010/104274 A2 | 9/2010 |
| WO | 2017/153590 A1 | 9/2017 |

OTHER PUBLICATIONS

JEDEC, "Environmental Acceptance Requirements for Tin Whisker Susceptibility of Tin and Tin Alloy Surface Finishes," JEDEC Standard, JESD201, Mar. 2006, 28 pages.

Oberndorff et al., "Whisker Formation on Sn Plating," *Proceedings of IPC/JEDEC Fifth International Conference on Lead-Free Electronic Components and Assemblies*, 2004.

U.S. Appl. No. 16/299,085, filed Mar. 12, 2018, Lead Frame Surface Finishing.

* cited by examiner

LEADFRAME WITH A METAL OXIDE COATING AND METHOD OF FORMING THE SAME

BACKGROUND

Technical Field

The present disclosure is directed to a leadframe that includes a metal oxide coating on at least a portion of a surface.

Description of the Related Art

Copper leadframes are commonly used in the packaging space. A semiconductor die is coupled to a central position of the leadframe, and is surrounded by leads. During the processing of the leads, layer(s) of tin are plated onto the surface of the copper. However, during the plating process, an intermetallic layer of copper tin ($Cu_6Sn_5$) is formed. A level of compressive stress in this layer causes monocrystalline tin whiskers to grow.

Such whiskers can reach lengths of $10^2$-$10^3$ micrometers ($\mu m$). Thus, the whiskers can contact adjacent leads and cause short circuits. Additionally, these whiskers are known to break and cause short circuits between other elements.

Several strategies have been employed to prevent this outcome. For example, it is common to perform a postbake step (e.g., 150° C. for one hour) after plating. This postbake step reduces or avoids the growth of whiskers by relaxing the compressive stress in the intermetallic layer. However, the postbake step does not prevent the intermetallic layer from forming, and thus, is not a completely effective solution.

Alternatively, the composition of the leadframe can be modified, for example, an iron-nickel alloy (e.g., $FeNi_{42}$) may be used. However, other leadframe compositions are incompatible with many plating chemistries for the tin layer. Thus, a change in the composition of the leadframe may also require that the plating chemistry be modified as well. Additionally, tin whiskers may still form during service due to the thermal dilation coefficients between the tin layer and the iron-nickel alloy of the leadframe. As such, modifying the composition of the leadframe is also not a completely effective solution to this problem.

Accordingly, there is a particular need for a leadframe that includes leads without the stressed intermetallic layer responsible for whisker formation.

BRIEF SUMMARY

The exemplary embodiments in the present disclosure are directed to improving reliability of integrated circuit packages by reducing the formation of tin whiskers and preventing corrosion on the leads of the leadframe in the package.

In one exemplary embodiment, a copper leadframe has radiating leads around a central die pad. A metal layer (e.g., nickel, silver, gold, etc.) is formed on at least a portion of a surface of the leadframe, such as on the surface of one or more of the leads. A metal oxide layer is formed on the metal layer. The metal oxide layer may be, for example, nickel oxide, silver oxide, gold oxide, or a combination thereof. In some embodiments, the metal layer and the metal oxide may comprise the same metal. The leadframe can then be incorporated into a package by coupling a die to the die pad, and bonding one or more wires between the die and leads of the leadframe. Then, a molding compound is formed over the die, the wires, and the leadframe to create the package. A tin layer may then be formed over at least a portion of the metal oxide layer that is exposed after the molding compound is formed.

In a second exemplary embodiment, a method of forming such a leadframe is described. The method may begin with a flat sheet of material, which is then shaped to form a die pad in a first surface of the sheet and leads radiating from the die pad. A metal layer is deposited onto at least a portion of the leadframe, such as on the surface of the leads. A metal oxide layer is then deposited onto the metal layer. A package is formed by following the above steps, including coupling a die to the die pad, bonding wires between the die and the leads, and forming a molding compound over the die, the wires, and the leadframe. A layer of tin may then be plated onto at least a portion of the leadframe that was not encapsulated in the molding compound.

BRIEF DESCRIPTION OF THE SEVERAL VIEWS OF THE DRAWINGS

For a better understanding of the embodiments, reference will now be made by way of example only to the accompanying drawings. In the drawings, identical reference numbers identify similar elements or acts. The sizes and relative positions of elements in the drawings are not necessarily drawn to scale. For example, the shapes of various elements and angles are not necessarily drawn to scale, and some of these elements may be enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with leadframes and chip packaging have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

The present disclosure is directed to improving reliability of packages containing leadframes by reducing the formation of tin whiskers and preventing corrosion on the leads of the leadframe in the package, thus reducing the possibility of a short caused by a whisker.

Figure 1:
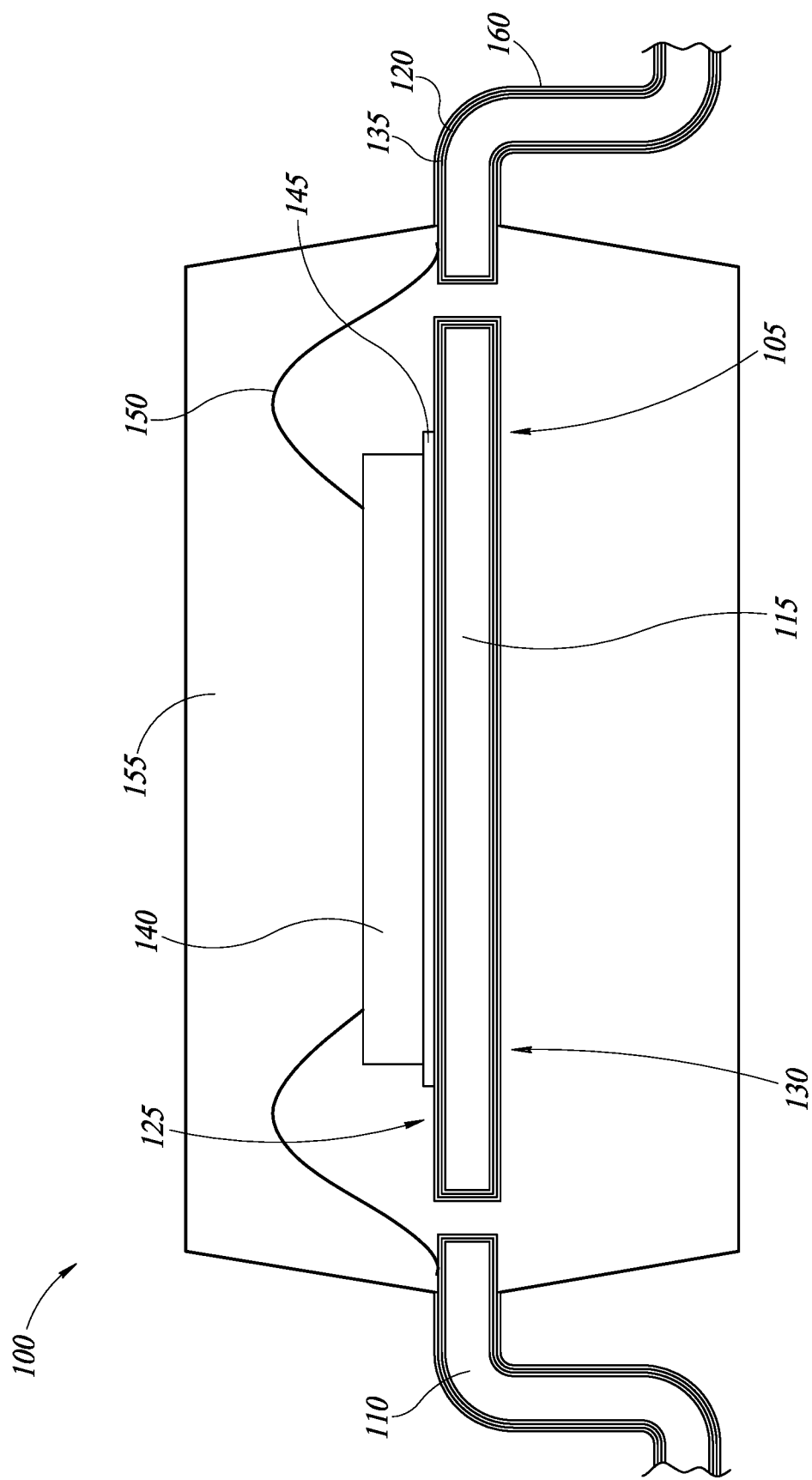
FIG. 1 is a cross-sectional view of a leadframe of the disclosure showing the leadframe incorporated into a package, according to one embodiment.

FIG. 1 is an exemplary embodiment of the present disclosure showing a cross-sectional view of a package 100 comprising a leadframe 105 during processing. In embodiments, the leadframe 105 includes a plurality of leads 110 spaced from a die pad 115. A die 140 is coupled to the die pad 115 of the lead frame 105. Wires 150 couple the die to the leads 110.

The die pad 115 and the leads 110 are covered by several layers, which include a metal layer 120 that is adjacent to the leadframe. There is a metal oxide layer 135 on the metal layer 120. Molding compound 155 is formed around the die 140, the leadframe 105, and parts of the leads 110. A tin layer 160 is on the metal oxide layer on surfaces of the metal oxide layer 135 that are not surrounded by the molding compound 155 (e.g., only portions of the leads 110). The tin layer 160 abuts the molding compound and only covers part of the leads.

The die pad 115 may have a rectangular shape. However, one of skill in the art will appreciate that the die pad 115 and the leadframe 105 can be formed to have alternate shapes, for example a circle.

In some embodiments the plurality of leads 110 includes an even number of leads 110 spaced equidistant from each other, with an identical number of leads 110 on each edge of the leadframe 105. However, other embodiments may include fewer, or more leads 110 with different spacing and arrangement in order to suit particular package requirements.

In various embodiments, the leadframe 105 is made of copper or a copper alloy, although other known metals, other conductive materials, or nonconductive materials may be used.

A layer of metal 120 is formed on at least a portion of a surface of the leadframe 105. In various embodiments, the layer of metal 120 may be formed on a first surface 125 of the leadframe 105. In some embodiments, the layer of metal 120 is formed on a second surface 130. As shown in FIG. 1, the layer of metal 120 is formed on all surfaces of the leadframe 105. In other embodiments, the layer of metal 120 is formed on surfaces of one or more of the plurality of leads 110.

In various embodiments, the layer of metal 120 comprises at least one transition metal. In some embodiments, the layer of metal 120 comprises a precious metal. In further embodiments, the layer of metal 120 comprises a group 10 or group 11 metal. In some embodiments, the layer of metal 120 comprises a group 10 metal. In other embodiments, the layer of metal 120 comprises a group 11 metal. In certain embodiments, the metal layer 120 comprises nickel, gold, silver, or a combination thereof. In particular embodiments, the metal layer 120 comprises silver.

In some embodiments, the layer of metal 120 has a thickness of at least about 0.01 micrometers (μm). In some embodiments, the layer of metal 120 has a thickness of at least about 0.05 μm. In some embodiments, the layer of metal 120 has a thickness of no more than 0.25 μm. In some embodiments, the layer of metal 120 has a thickness of no more than 0.2 μm. In some embodiments, the layer of metal 120 has a thickness ranging from about 0.01 μm to about 0.2 μm. In other embodiments, the layer of metal 120 has a thickness ranging from about 0.05 μm to about 0.15 μm. In particular embodiments, the layer of metal 120 has a thickness of about 0.1 μm.

A metal oxide layer 135 is formed on at least a portion of the metal layer 120. Accordingly, embodiments of the present disclosure include a device comprising a copper leadframe, a metal layer on at least a portion of the copper leadframe, and a metal oxide layer on the metal layer. In some embodiments, the metal layer 120 and the metal oxide layer 135 are formed at least on the leads 110 of the leadframe 105.

The metal oxide layer 135 may comprise the same metal(s) as the metal layer 120. Thus, the metal oxide layer 135 may comprise at least one transition metal. In some embodiments, the metal oxide layer 135 comprises a precious metal. In some embodiments, the metal oxide layer 135 comprises a group 10 or group 11 metal. In certain embodiments, the metal oxide layer 135 comprises nickel oxide, gold oxide, silver oxide, or a combination thereof. In particular embodiments, the metal oxide layer 135 comprises silver oxide. In specific embodiments, the metal layer 120 is a layer of silver and the metal oxide layer 135 is silver oxide.

In embodiments, the metal oxide layer 135 has a thickness of at least about 0.5 nanometers (nm). In some embodiments, the metal oxide layer 135 has a thickness of at least about 1 nm. In some embodiments, the metal oxide layer 135 has a thickness of no more than about 5 nm. In further embodiments, the metal oxide layer 135 has a thickness ranging from about 0.5 nm to about 3.5 nm. In other embodiments, the metal oxide layer 135 has a thickness ranging from about 1.5 nm to about 2.5 nm. In particular embodiments, the metal oxide layer 135 has a thickness of about 2 nm.

In embodiments, the die 140 may be coupled to the die pad 115 with the glue or tape 145. Then, the plurality of wires 150 are bonded between pillars or bumps on the die 140 and contact pads on the plurality of leads 110. The coupling between the wires 150 and the die 140 may be accomplished via one or more electrical contacts, which may be contact pads, pillars or solder bumps extending from the die 140 and one or more contact pads or lands on the leads 110.

The molding compound 155 is deposited over the plurality of wires 150, the leadframe 105, the leads 110, the die pad 115, the layer of metal 120, and the metal oxide layer 135 to form the package 100. In the package 100, the molding compound 155 may completely surround the metal oxide layer 135, as shown in FIG. 1. In some embodiments, the molding compound 155 is formed on the plurality of wires 150, the leadframe 105, the leads 110, the die pad 115, a surface of the layer of metal 120, and a surface of the metal oxide layer 135.

A layer of tin 160 is formed on at least a portion of the metal oxide layer 135. In embodiments, the layer of tin 160 is formed on the portion of the leads 110 that is exposed or remains exposed after the molding compound 155 is deposited or otherwise formed.

Accordingly, embodiments of the present disclosure include a device that comprises a copper leadframe; a metal oxide layer on at least a first portion of the copper leadframe; and a tin layer on at least a second portion of the copper leadframe, the metal oxide layer being between the tin layer and the copper leadframe. In some embodiments, the first portion of the copper leadframe is larger than the second portion, and includes the second portion.

In some embodiments, a surface of the metal oxide layer 135 on surface 130 of the die pad 115 is exposed. In such embodiments, a layer of tin 160 may be formed on the exposed surface of the metal oxide layer 135.

In various embodiments, the layer of tin 160 is separated from the copper leadframe 105, which reduces the formation of tin whiskers. In such embodiments, the likelihood of shorting is reduced.

In embodiments, the layer of tin 160 has a thickness of at least about 4 µm. In some embodiments, the layer of tin 160 has a thickness of at least about 5 µm. In some embodiments, the layer of tin 160 has a thickness of at least about 7 µm. In some embodiments, the layer of tin 160 has a thickness of no more than about 15 µm. In some embodiments, the layer of tin 160 has a thickness of no more than about 10 µm. In particular embodiments, the layer of tin 160 has a thickness of about 7 µm.

The packaging structure includes, in some embodiments, a silver layer on a bare copper leadframe, a silver oxide layer on the silver layer, and a tin layer on the silver oxide layer. A molding compound surrounds a portion of the silver oxide layer, and the tin layer abuts the molding compound. Accordingly, in some embodiments, the silver oxide layer is completely covered by the molding compound and the tin layer. In specific embodiments, the series of layers on the bare copper leadframe includes a silver layer that is about 0.1 µm thick, a silver oxide layer that is about 2 nm, and a tin layer that is about 7 µm thick.

The process of forming a package 100 of the disclosure is shown in more detail in the cross-sectional views of FIGS. 2-7.

Figure 2:
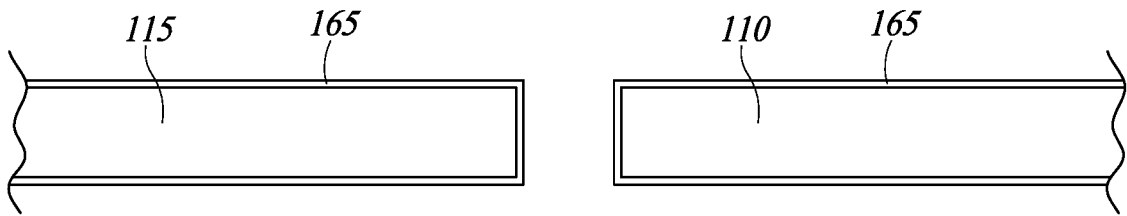
FIG. 2 shows a cross-sectional view of a step of a method of forming a package of the disclosure, according to one embodiment.

FIG. 2 shows a cross-sectional view of leadframe 105 during processing to form a package, such as package 100. The leadframe is a metal sheet that is shaped or stamped to form a die pad and a plurality of leads. A strike layer 165 is a conductive material and is formed on a surface of the leadframe 105. In embodiments, the strike layer 165 is a copper or copper alloy. The strike layer 165 may be formed using any suitable method. For example, the strike layer 165 may be deposited by electrolytic deposition, chemical-vapor deposition (CVD), sputtering, electroless plating, spray-coating, etc. In certain embodiments, the strike layer 165 is deposited by electrolytic deposition on the surface of the leadframe 105. In some embodiments, the strike layer 165 is selectively deposited (e.g., using a mechanical mask or some other masking technique) so as to extend selectively only over certain areas.

In embodiments, the strike layer 165 has a thickness of at least about 0.5 µm. In some embodiments, the strike layer 165 has a thickness of at least about 1 µm. In some embodiments, the strike layer 165 has a thickness of no more than about 5 µm. In some embodiments, the strike layer 165 has a thickness of about 2 µm.

In some embodiments, the leadframe is treated before the strike layer 165 is applied. Such treatments may include electrocleaning, which may be used to remove oxides, impurities, organic materials, and the like from the surface of the leadframe. Other treatment steps that may be used include activation treatments. In some embodiments, activation treatments include use of an acidic etchant solution (e.g., Descabase (Atotech Deutschland GmbH), a sulfuric acid solution, etc.). An activation treatment may be used to remove oxides and to activate the leadframe 105 in order to improve the adhesiveness and uniformity of the strike layer 165. A rinsing step may be employed before the treatment step(s), between the treatment step(s), after the treatment step(s) and before the strike layer 165 is applied, after the strike layer 165 is applied, or any combination thereof.

Figure 3:
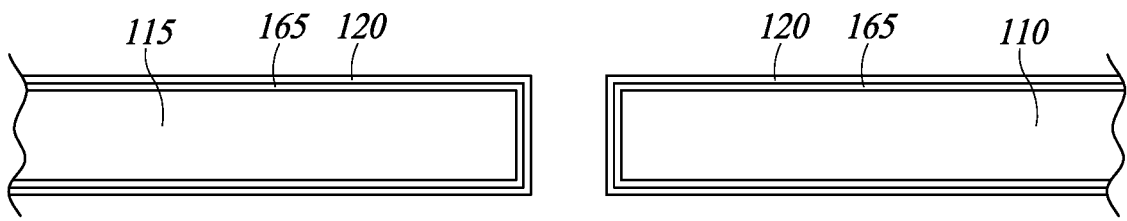
FIG. 3 shows a cross-sectional view of a step of a method of forming a package of the disclosure, according to one embodiment.

FIG. 3 shows a cross-sectional view of leadframe 105 during processing. A metal layer 120 is formed on the surface of the strike layer 165. The metal layer 120 may be formed using any suitable method. For example, the strike layer 165 may be deposited by electrolytic deposition, CVD, sputtering, electroless plating, spray-coating, etc. In particular embodiments, the metal layer 120 is deposited by electrolytic deposition on the surface of the strike layer 165. In some embodiments, the metal layer 120 is selectively deposited (e.g., using a mechanical mask or some other masking technique) so as to extend selectively only over certain areas. In specific embodiments, the strike layer 165 is a copper layer and the metal layer 120 is a silver layer.

In various embodiments, the leadframe 105 with the strike layer 165 may be treated before the metal layer 120 is formed. For example, an activation treatment may be used. In particular embodiments, the activation treatment is an AgP activator. A rinsing step may be employed before the treatment step, after the treatment step and before the metal layer 120 is applied, after the metal layer 120 is applied, or any combination thereof.

Figure 4:
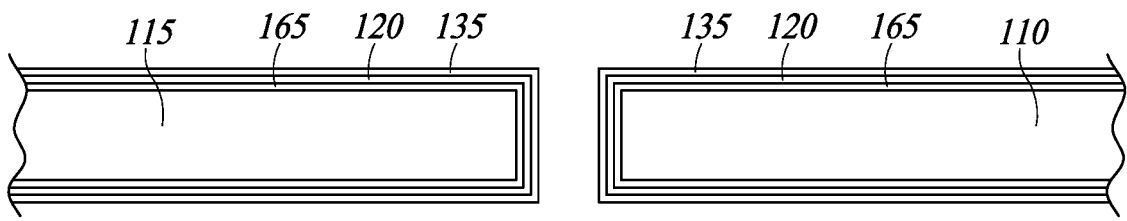
FIG. 4 shows a cross-sectional view of a step of a method of forming a package of the disclosure, according to one embodiment.

FIG. 4 shows a cross-sectional view of the metal oxide layer 135 formed on the metal layer 120 during processing. The metal oxide layer 135 can be formed using any suitable method. For example, the surface of the metal layer 120 can be oxidized using methods known in the art.

The surface of the metal layer 120 may be treated before the metal oxide layer 135 is formed. For example, an activation treatment may be used. In particular embodiments, the activation treatment is an AgP activator. A rinsing step may be employed before the treatment step, after the treatment step and before the metal oxide layer 135 is formed, after the metal oxide layer 135 is formed, or any combination thereof.

Figure 5:
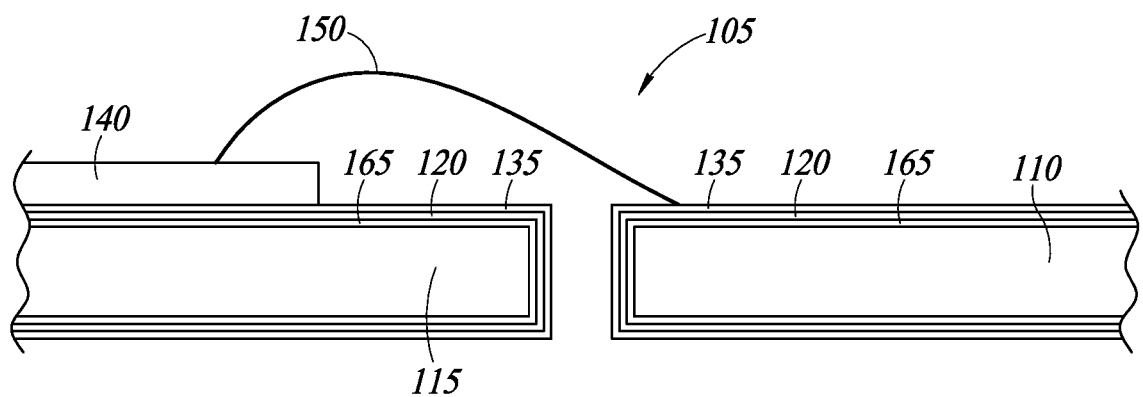
FIG. 5 shows a cross-sectional view of a step of a method of forming a package of the disclosure, according to one embodiment.

FIG. 5 shows a cross-sectional view of the leadframe assembly after the die 140 has been attached. The die 140 may be coupled to the surface of the metal oxide layer 135 by any suitable method, e.g., tape or glue. The die 140 is then wirebonded to the leads 110. Once the die 140 is attached to the die pad 115, the plurality of wires 150 are bonded between pillars or bumps on the die 140 and the contact pads or lands on the plurality of leads 110.

In embodiments, an organic coating is applied to the surface of the metal oxide layer 135. Such an organic coating (e.g., an anti-EBO (epoxy bleed out) coating) may reduce or eliminate epoxy bleeding out during the die attachment. A rinsing step may be employed after the organic coating is applied.

Figure 6:
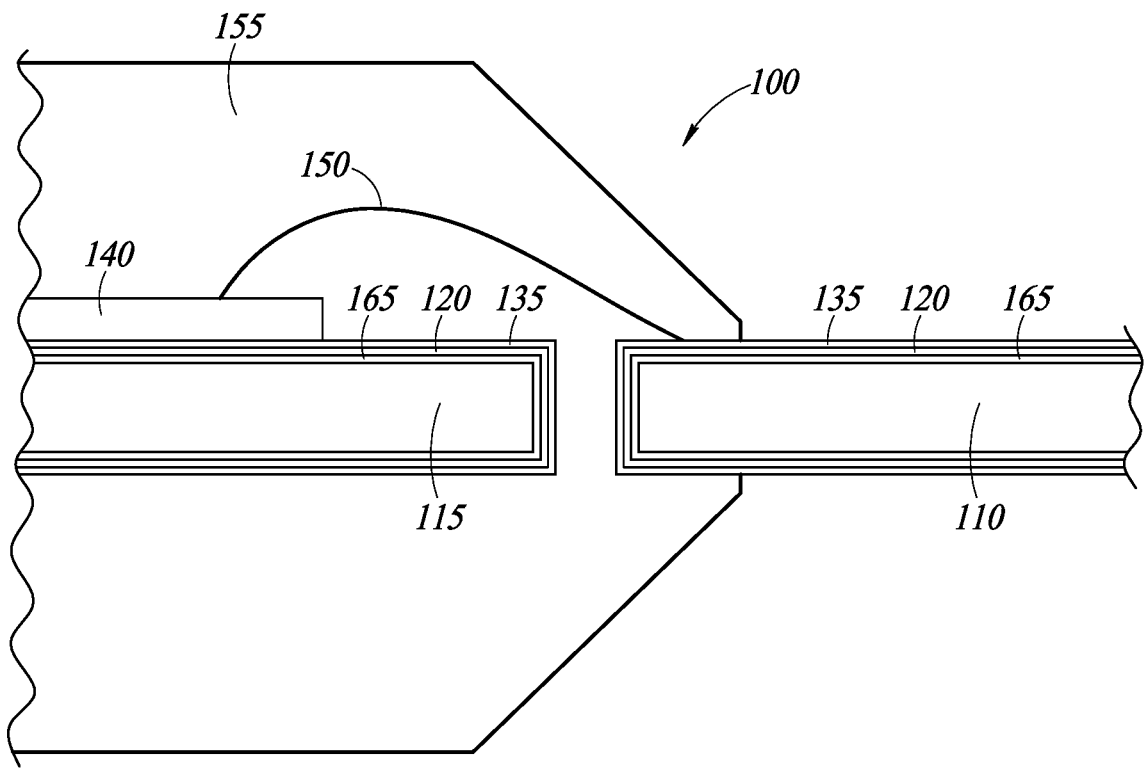
FIG. 6 shows a cross-sectional view of a step of a method of forming a package of the disclosure, according to one embodiment.

After the die 140 and wires 110 are in place, the molding compound 155 is formed on the die 140, the wires 110, and the leadframe 105 to form the package 100, as shown in FIG. 6. In various embodiments, a portion of the leads are also encapsulated by the molding compound 155.

A deflashing step may then be used to remove resin flashes from the molding process. An electrocleaning step, rinse step, or both may be employed after the molding compound is applied. An electrocleaning step may be used, for example, to remove oxides, impurities, organic materials, and the like from the exposed surface of the leadframe.

Figure 7:
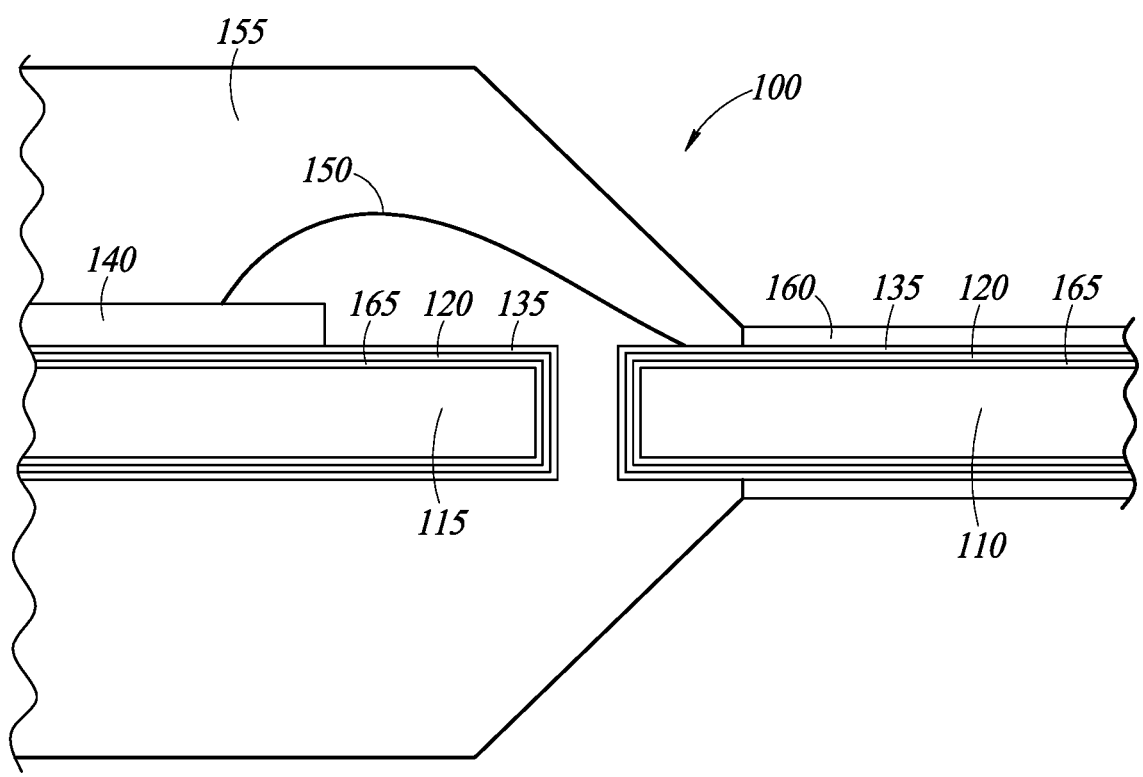
FIG. 7 shows a cross-sectional view of a step of a method of forming a package of the disclosure, according to one embodiment.

As shown in FIG. 7, a tin layer 160 is formed on at least a portion of the exposed surfaces of the metal oxide layer 135. The tin layer 160 may be formed using any suitable method. For example, the strike layer 165 may be deposited by electrolytic deposition, CVD, sputtering, electroless plating, spray-coating, etc. In some embodiments, the tin layer 160 is selectively deposited (e.g., using a mechanical mask or some other masking technique) so as to extend selectively only over certain areas, such as the exposed portions of the metal oxide layer 135.

In some embodiments, the surface of the leadframe opposite the surface on which the die is attached is exposed after the molding compound is deposited. In such embodiments, tin layer 160 is formed on the exposed surface.

Figure 8:
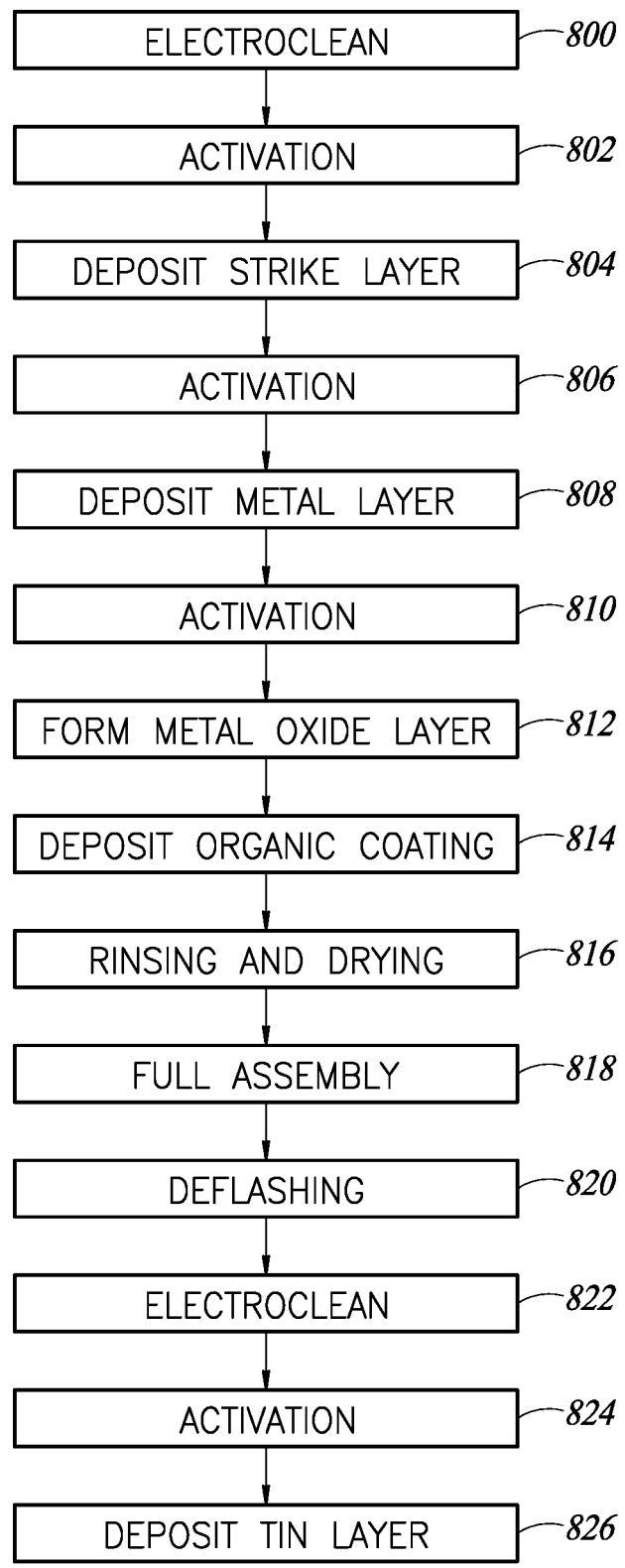
FIG. 8 is a flow chart of an illustrative method of the disclosure, according to one embodiment, according to one embodiment.

A flow chart of an illustrative method of the disclosure is shown in FIG. 8. After an initial electrocleaning step 800, the leadframe 105 may undergo an activation step 802 followed by deposition of a strike layer 165 in step 804. Then, in step 806, the leadframe 105 may undergo a second activation step. A metal layer 120 is then deposited onto the surface of the strike layer 165 in step 808.

A third activation step 810 is then performed, followed by formation of the metal oxide layer 135 in step 812. In step 814, an organic coating is applied to the surface of the metal oxide layer 135. One or more rinsing and drying steps, such as step 816, may be employed at any suitable point in the methods disclosed.

Next, in step 818, the die 140 has been attached to the surface of the metal oxide layer 135 and the molding compound 155 is formed on the die 140, the wires 110, and the leadframe 105 to form the package 100. After assembling the package 100, a deflashing step can be employed to remove resin flashes from the molding process. Then, an electrocleaning step 822, rinse step, or both may be employed.

A fourth activation step 824 can then be performed to prepare the surface for deposition of the tin layer 160, in step 826.

The resulting packaging structure includes, in some embodiments, a copper strike layer on a bare copper leadframe, a silver layer on the copper strike layer, a silver oxide layer on the silver layer, and a tin layer on the silver oxide layer. A molding compound surrounds a portion of the silver oxide layer and the tin layer abuts the molding compound. Thus, no portion of the silver oxide layer is exposed. In other words, the molding compound and the tin layer completely cover the silver oxide layer. In specific embodiments, the series of layers on the bare copper leadframe includes a copper strike layer that is about 2 μm thick, a silver layer that is about 0.1 μm thick, a silver oxide layer that is about 2 nm, and a tin layer that is about 7 μm thick.

As will be readily appreciated from the foregoing, the present disclosure achieves a leadframe that reduces the possibility of whisker formation on the leads. Each of the disclosed embodiments provides a solution to the above described issues with leadframes by separating the tin plating layer from the copper leadframe, thereby eliminating the stressed intermetallic layer formed when tin is deposited directly onto copper. By preventing formation of the monocrystalline tin whiskers, the likelihood of shorts caused by the whiskers is reduced, and the overall reliability of the device produced is increased. Additionally, because the stressed intermetallic layer is not formed, a previously-required postbaking step is no longer required. As an added benefit, the combination of layers provides improved corrosion resistance over current technologies.

In one embodiment, the layers on the lead are copper, silver, and tin. Other variations include tin with lead. The leadframe could be lead with tin layers on the lead leads. Alternatively, lead may be a layer on a conductive leadframe with a tin layer on the lead (Pb).

Figure 9:
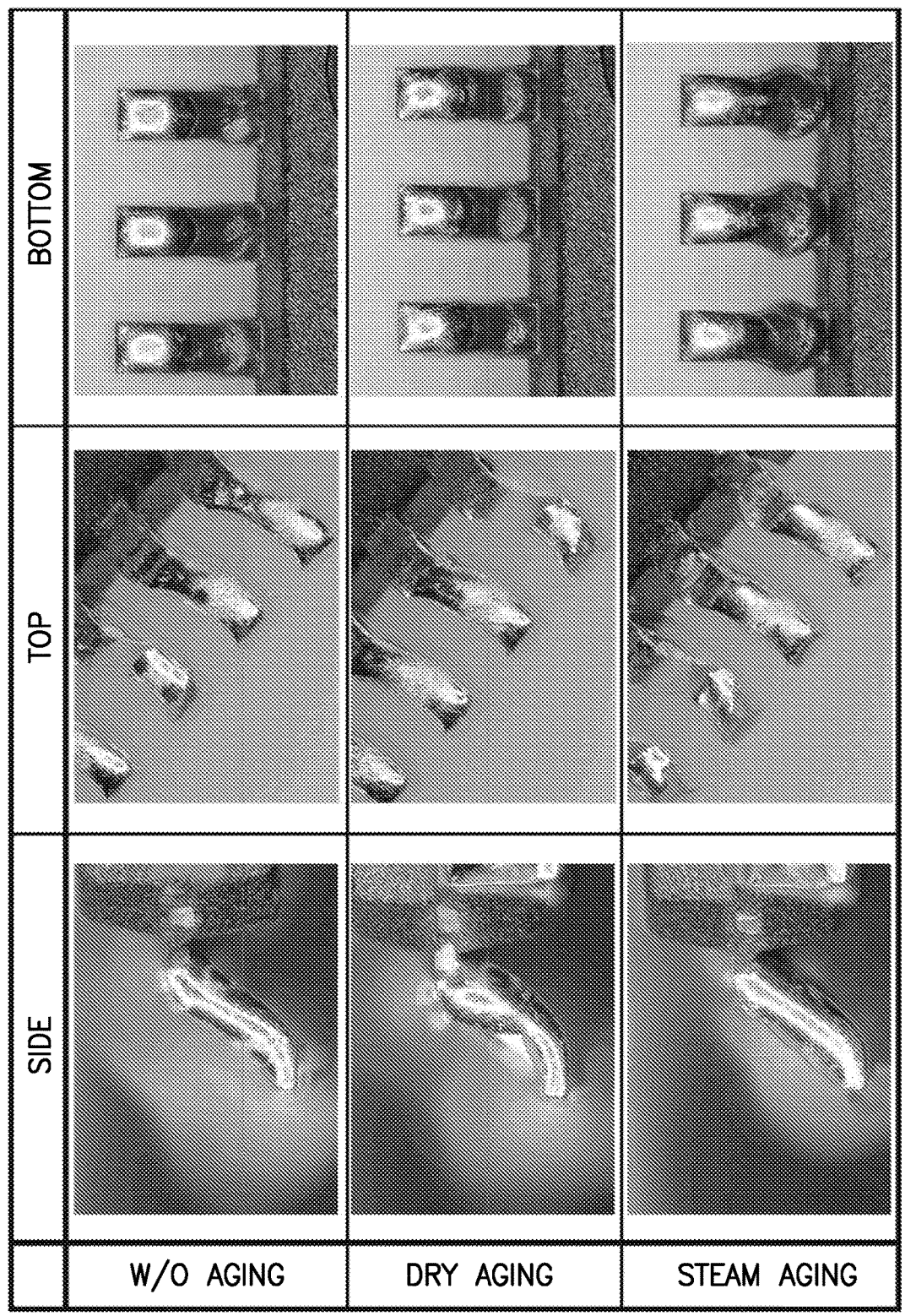
FIG. 9 is a series of photos of exemplary package structures after reflow, according to one embodiment.

Exemplary package structures were produced and tested. Photos of the leads after reflow are shown in FIG. 9. Before reflow, all samples were substantially the same. Samples were tested without aging (as shown in the top row of the photos), with dry aging at 155° C. for 4 hours (as shown in the middle row of the photos), and steam aging for 1 hour (as shown in the bottom row of the photos). As shown in the middle row of photos, the portion of the lead closest to the molding compound becomes bulbous and has a thickness that is greater than the portion of the lead furthest from the molding compound. As shown in the bottom row of photos, the portion of the lead closest to the molding compound becomes bulbous and has a width that is greater than the width of the portion of the lead furthest from the molding compound.

Figure 10:
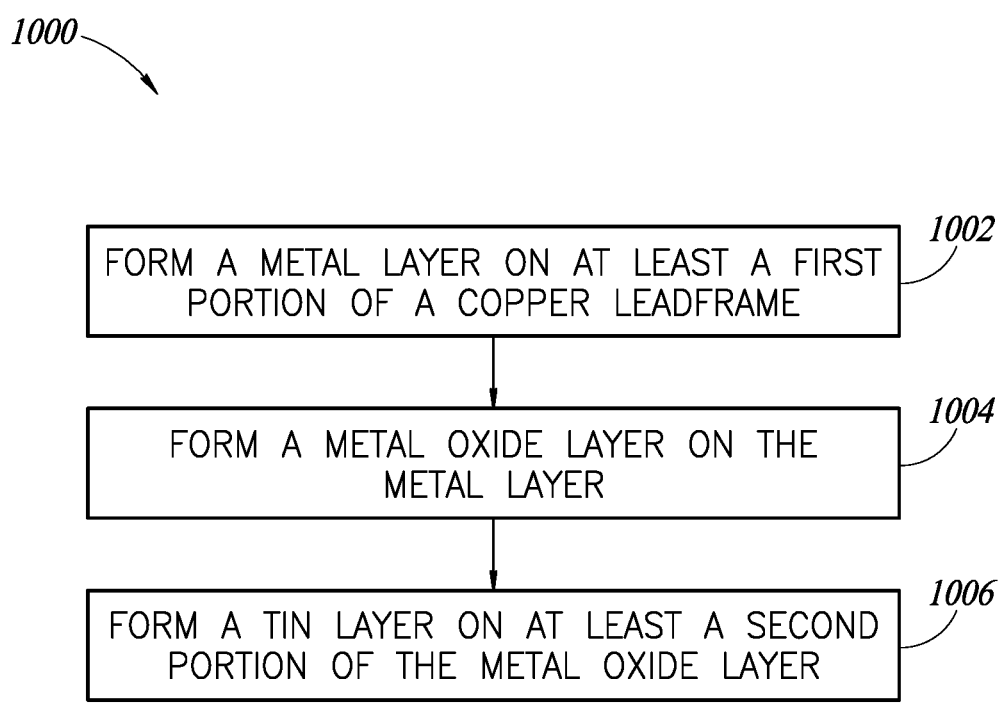
FIG. 10 is flow chart of an illustrative method for forming a leadframe package, according to one embodiment.

FIG. 10 is a flow diagram of a method 1000 for forming a leadframe, package according to one embodiment. At 1002 the method 1000 includes forming a metal layer on at least a first portion of a copper leadframe. At 1004, the method 1000 includes forming a metal oxide layer on the metal layer. At 1006, the method 1000 includes forming a tin layer on at least a second portion of the metal oxide layer.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
 a copper leadframe including:
  a die pad; and
  a lead;
 a die on the die pad;
 a metal layer on the lead and the die pad between the die and the die pad;
 a metal oxide layer on the metal layer on the lead and on the die pad between the die and the die pad;
 a molding compound encapsulating the die pad and a first portion of the lead, the molding compound in contact with the metal oxide layer at the first portion of the lead;
 a tin layer on a second portion of the lead, wherein the tin layer is not covered by the molding compound in cross section, wherein the tin layer abuts a side of the molding compound; and
 a bonding wire extending from the die and contacting the metal oxide layer at the first portion of the lead.

2. The device of claim 1, wherein the metal layer is arranged on a first side of the copper leadframe.

3. The device of claim 2, wherein the metal layer is arranged on a second side of the copper leadframe that is opposite the first side of the copper leadframe.

4. The device of claim 1, further including a molding compound on at least a second portion of the metal oxide layer.

5. The device of claim 1, wherein the metal layer includes nickel, gold, silver, or a combination thereof.

6. The device of claim 5, wherein the metal oxide layer includes nickel oxide, gold oxide, silver oxide, or a combination thereof.

7. A device comprising:
 a copper leadframe including:
  a die pad; and
  a lead;
 a semiconductor die on the die pad;
 a metal oxide layer on the lead and the die pad between the die and the die pad;
 a tin layer on at least a second portion of the copper leadframe, the metal oxide layer being between the tin layer and the copper leadframe;
 a molding compound encapsulating the die pad and a first portion of the lead, the molding compound in contact with the metal oxide layer at the first portion of the lead, wherein the tin layer is not covered by the molding compound in cross-section, wherein the tin layer abuts a side of the molding compound; and
 a bonding wire extending from the die and contacting the metal oxide layer at the first portion of the lead.

8. The device of claim 7, further including a first metal layer on at least a third portion of the copper leadframe, the first metal layer being between the copper leadframe and the metal oxide layer.

9. The device of claim 8, wherein the first metal layer includes silver and the metal oxide layer includes silver oxide.

10. The device of claim 8, further including a second metal layer between the first metal layer and the copper leadframe.

11. A device, comprising:
 a lead frame including:
  a die pad; and
  a lead;
 a copper layer on the lead and the die pad;
 a die on the die pad;
 a metal layer on the copper layer on the lead and the die pad between the die and the die pad; and
 a metal oxide layer on the metal layer on the lead and on the die pad between the die and the die pad; and
 a molding compound encapsulating the die pad and a first portion of the lead, the molding compound in contact with the metal oxide layer at the first portion of the lead;
 a tin layer on a second portion of the lead, wherein the tin layer is not covered by the molding compound in cross-section, wherein the tin layer abuts a side of the molding compound; and
 a bonding wire extending from the die and contacting the metal oxide layer at the first portion of the lead.

12. The device of claim 11, wherein the metal oxide layer is present at a second portion of the lead not encapsulated by the molding compound.

13. The device of claim 11, wherein the metal layer includes nickel, gold, silver, or a combination thereof.

14. The device of claim 13, wherein the metal oxide layer includes nickel oxide, gold oxide, silver oxide, or a combination thereof.

* * * * *